United States Patent

Canu et al.

[11] Patent Number: 5,712,569
[45] Date of Patent: Jan. 27, 1998

[54] TESTER FOR TESTING CORRECT ASSEMBLY OF TERMINALS IN CONNECTOR HOUSINGS

[75] Inventors: André Canu, Beauchamp; François Dalle, Argenteuil, both of France

[73] Assignee: The Whitaker Corporation, Wilmington, Del.

[21] Appl. No.: 543,685

[22] Filed: Oct. 16, 1995

[30] Foreign Application Priority Data

Nov. 2, 1994 [FR] France .................................. 94 13069

[51] Int. Cl.$^6$ .................................................. G01R 31/04
[52] U.S. Cl. ........................................... 324/538; 439/489
[58] Field of Search ........................... 324/537, 538, 324/754, 755, 756, 761; 439/489, 488

[56] References Cited

U.S. PATENT DOCUMENTS

| | | | |
|---|---|---|---|
| 4,777,445 | 10/1988 | Kahl | 324/538 |
| 5,122,070 | 6/1992 | Lebris et al. | 324/761 X |
| 5,455,515 | 10/1995 | Saijo et al. | 324/538 |
| 5,498,966 | 3/1996 | Yamamoto | 324/538 |
| 5,512,833 | 4/1996 | Fukuda et al. | 324/538 |
| 5,586,900 | 12/1996 | Yagi et al. | 324/538 X |

Primary Examiner—Michael Brock
Attorney, Agent, or Firm—Driscoll Nina

[57] ABSTRACT

A terminal assembly tester comprises a contact probe module having electrical contact probes. The contact probes have a contact surface biasable against tips of electrical terminal mounted in cavities of a connector housing. The connector housing comprises integrally moulded resilient locking lances that are separated from housings walls by a slot. Extensions of the contact probes are insertable into the housing slots when contacting the terminal tips. If a terminal is not fully inserted into a cavity, the resilient locking lances are biased into the slot and prevent insertion of the contact probe tip thereinto thereby ensuring that the contact probe does not electrically contact the terminal. The latter thus ensures that even almost completely inserted terminals will not be electrically contacted and thus provides for a reliable testing mechanism.

7 Claims, 5 Drawing Sheets

TESTER FOR TESTING CORRECT ASSEMBLY OF TERMINALS IN CONNECTOR HOUSINGS

BACKGROUND OF THE INVENTION

1. Field of the Invention

This invention relates to an electrical tester for testing the full and complete assembly of electrical terminals of a connector assembly.

2. Description of the Prior Art

In the manufacturing of electrical harnesses comprising conducting wires and connectors assemblies attached to the ends thereof, it is common to include a station for testing the correct assembly of terminals attached to the leads within the connector assemblies. A testing station may include a housing comprising a plurality of spring loaded contact probes that are biased against the connector, the contact probes aligned and making electrical contact with terminals mounted in cavities of the housing. If a terminal is not fully inserted within a connector assembly, the terminal is thus axially displaced from the mating face of the connector assembly and the contact probe should thus not make contact therewith. The latter however is not always the case. Terminals which have been almost fully inserted but where the locking means are not engaged to that of the housing may make electrical contact with the contact probe due to the certain axial spring travel that the contact probes must have to absorb differences in tolerances between the contact module and the mating ends of the terminals. It would thus be desirable to provide a more reliable means of ensuring that terminals are correctly and completely assembled to the corresponding connector assemblies.

SUMMARY OF THE INVENTION

It is therefore an object of this invention to provide a tester for testing correct and complete insertion of terminals in a connector assembly, that is reliable, cost-effective and easy to operate.

It is a further object of this invention to provide a tester for testing correct and complete insertion of electrical terminals in corresponding connector assembly housings, that is reliable, and that is easily adaptable for either manual operation or for use in a fully automated manner.

The objects of this invention have been achieved by providing a terminal assembly tester for testing the full and correct insertion of terminals in corresponding cavities of a connector housing, the housing having resilient integral locking lances projecting into terminal receiving cavities for locking of the terminals therein, the tester having a plurality of spring mounted electrical probes aligned with and biasable against the terminals of the connector assembly, characterized in that the probes comprise a contact surface for contacting a corresponding terminal, and an extension extending axially therefrom and insertable alongside a face of the housing locking lance directed away from the terminal if the terminal is fully assembled to the housing, thus allowing contact surface to abut the terminal. If the terminal is not fully inserted into the connector housing, the locking lance is biased away from the terminal and upon insertion of a contact probe, the extension abuts a free end of the locking lance and prevents further insertion of the probe, thereby avoiding contact of the probe contact surface with the terminal.

DETAILED DESCRIPTION OF THE PREFERRED EMBODIMENT

Figure 1:
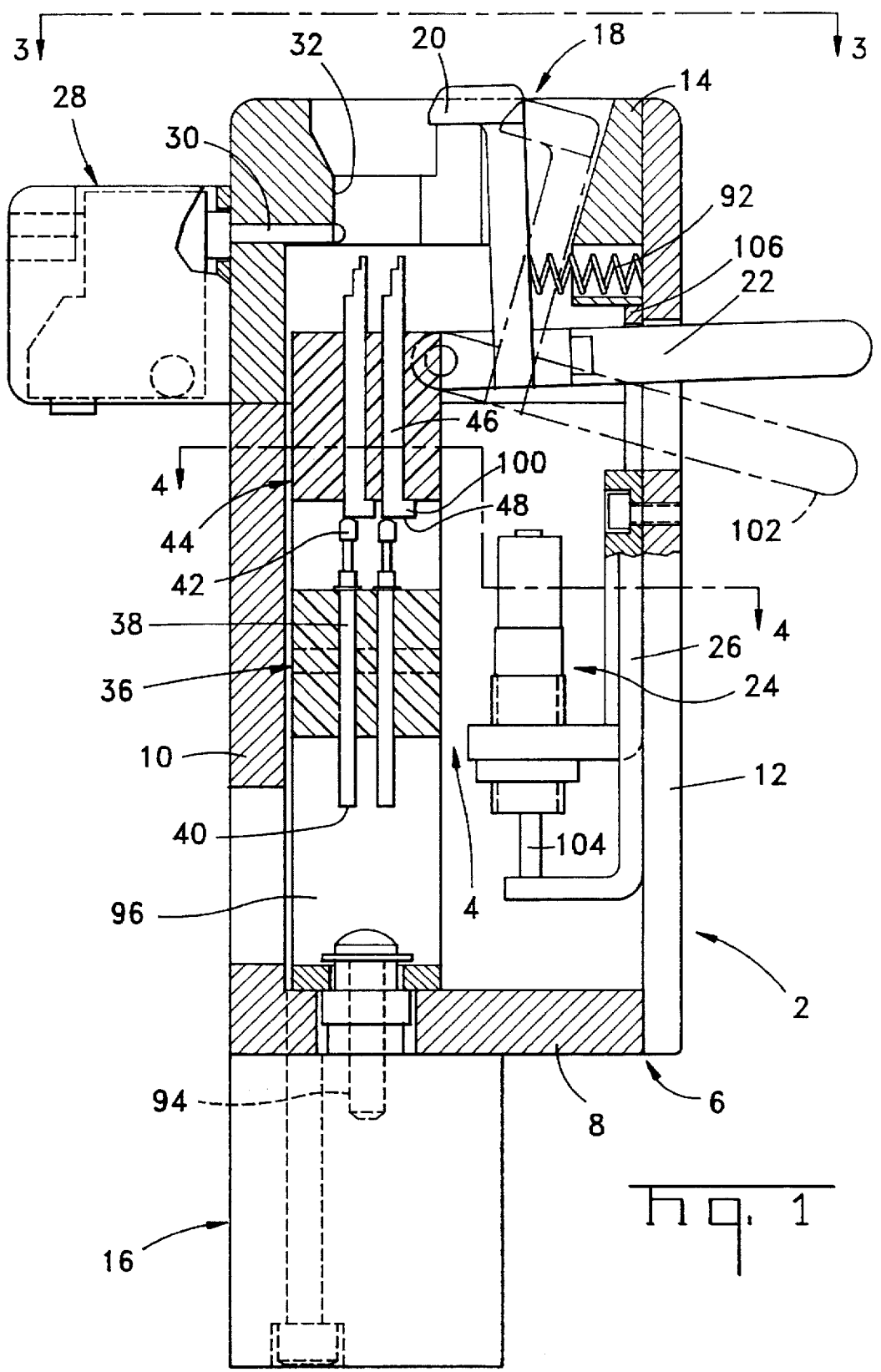
FIG. 1 is a cross-sectional view through a tester through lines 1—1 of FIG. 3.

Referring first to FIGS. 1–4, a terminal assembly tester 2 comprises a testing module 4 mounted to a support frame 6 having a base plate 8, front and back plates 10,12 and a connector receiving face plate 14. The tester further comprises a piston motor 16 for actuating axial movement of the module 4, a connector retention member 18 having a connector retention hook 20 attached to a pivot mounted lever arm 22 projecting through the back wall 12, and a piston motor 24 connected via an arm 26 to the lever arm 22. The tester 2 further comprises a switch 28 having a button 30 for detecting presence of a connector within a connector receiving cavity 32 of the connector receiving plate 14.

Figure 2:
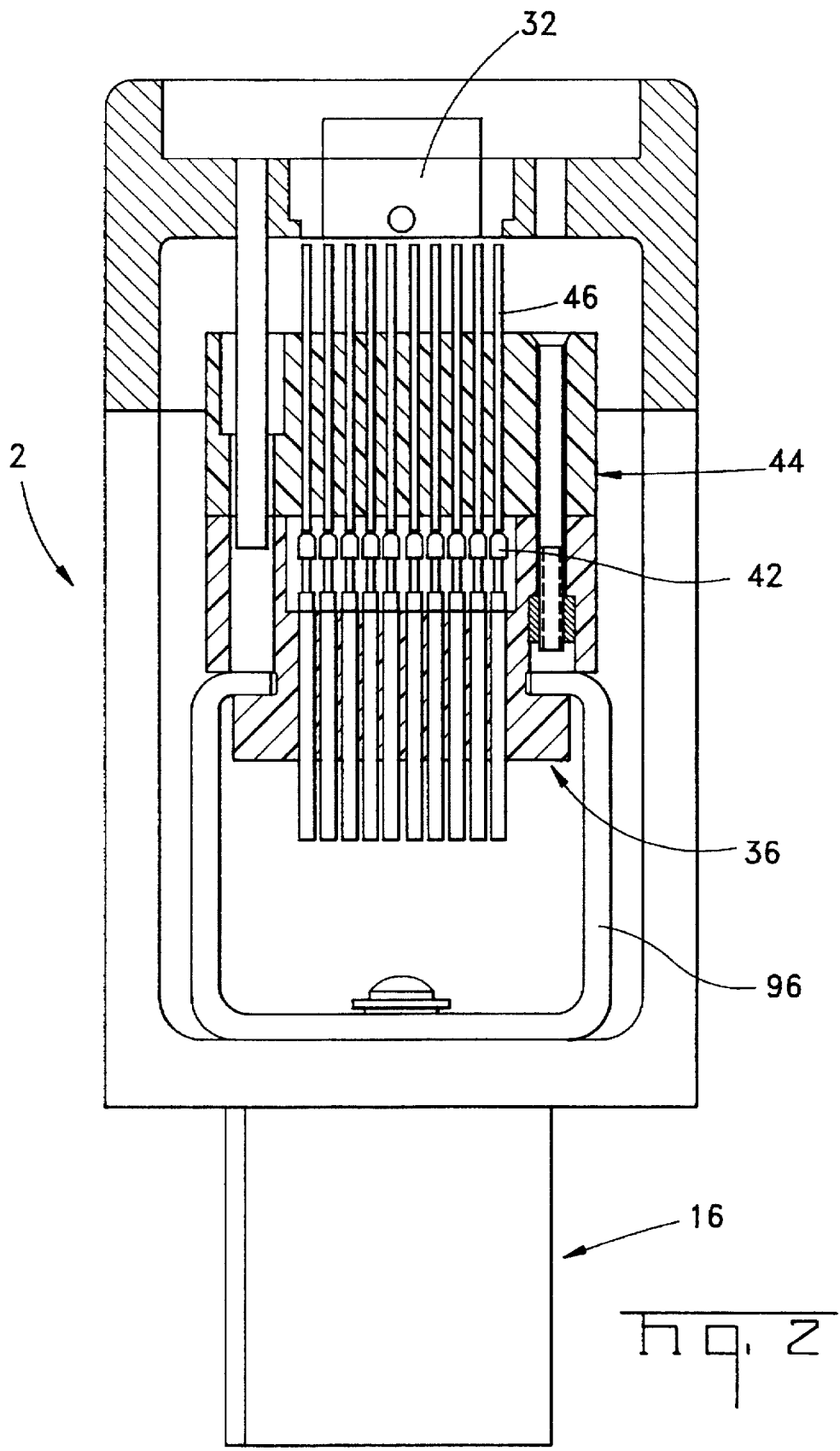
FIG. 2 is a cross-sectional view of the tester through lines 2—2 of FIG. 3.
Figure 3:
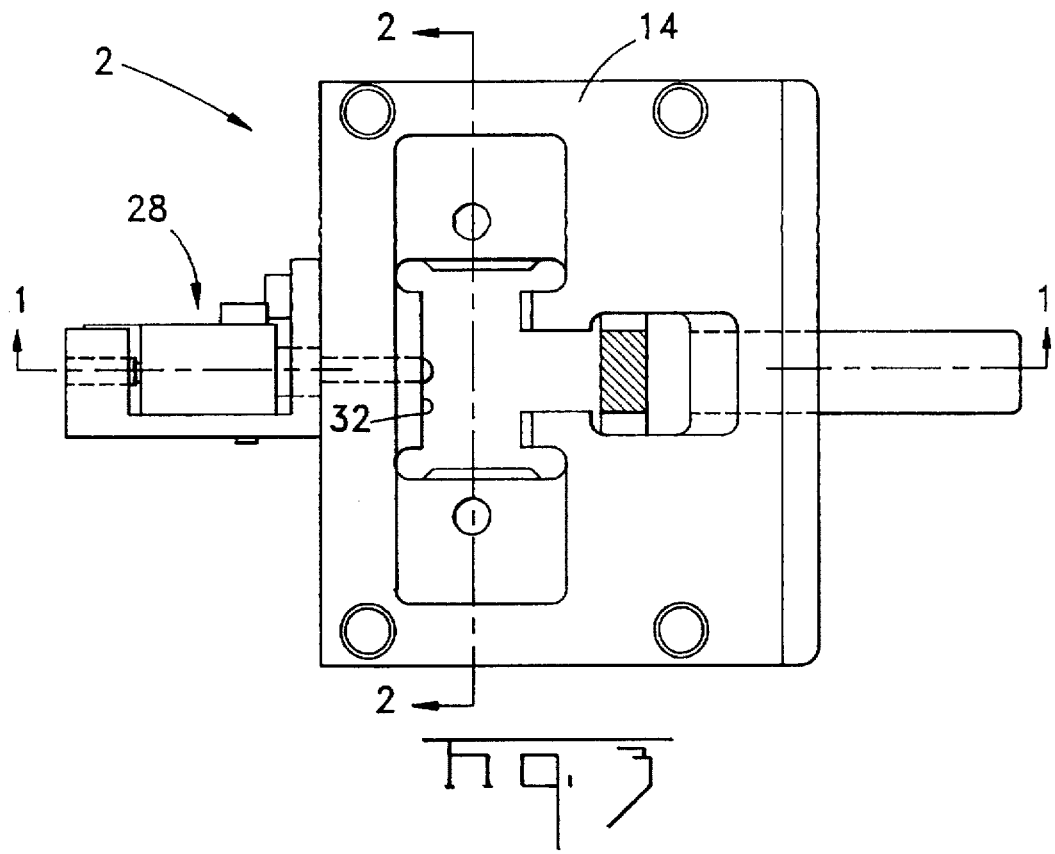
FIG. 3 is a top view in the direction of arrow 3 of FIG. 1.
Figure 4:
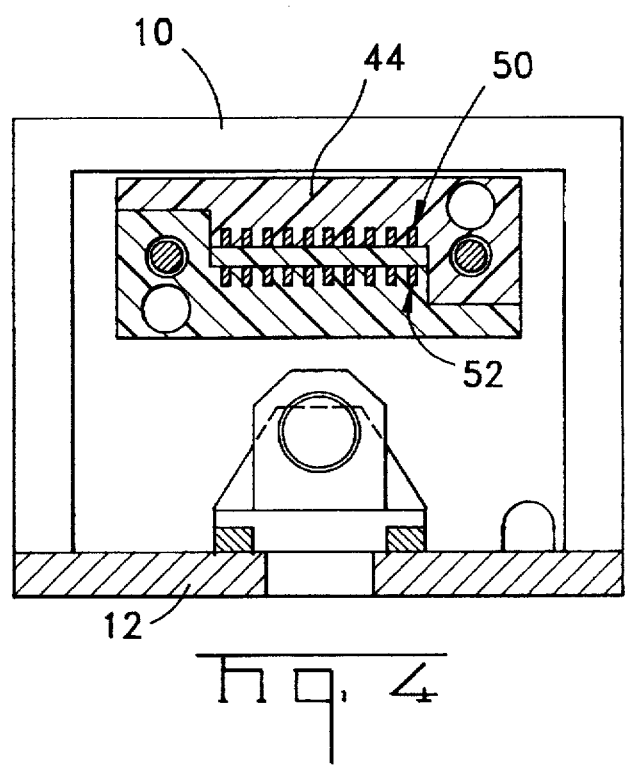
FIG. 4 is a cross-sectional view through lines 4—4 of FIG. 1.
Figure 5:
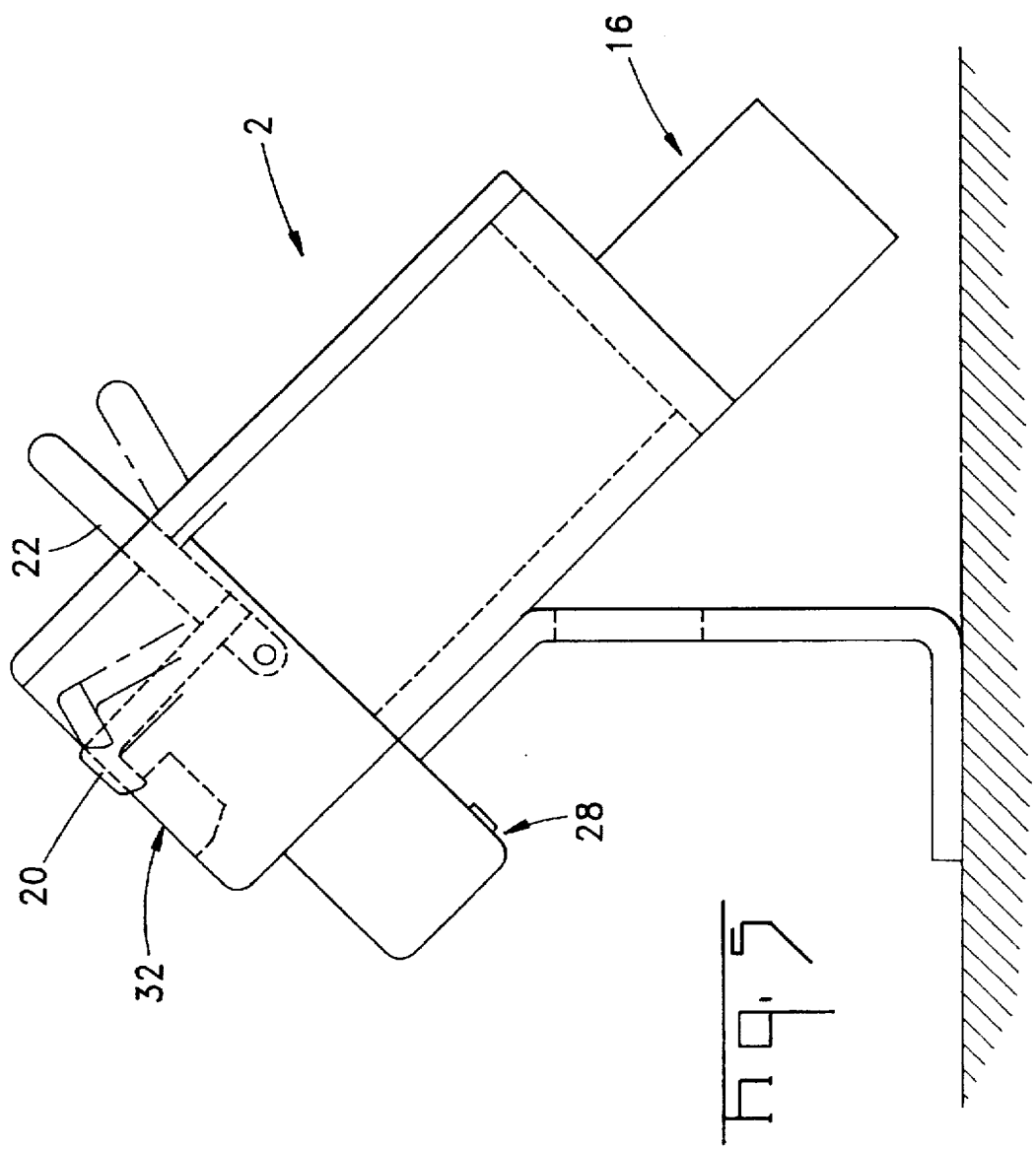
FIG. 5 is a side view of the terminal assembly tester.
Figure 6:
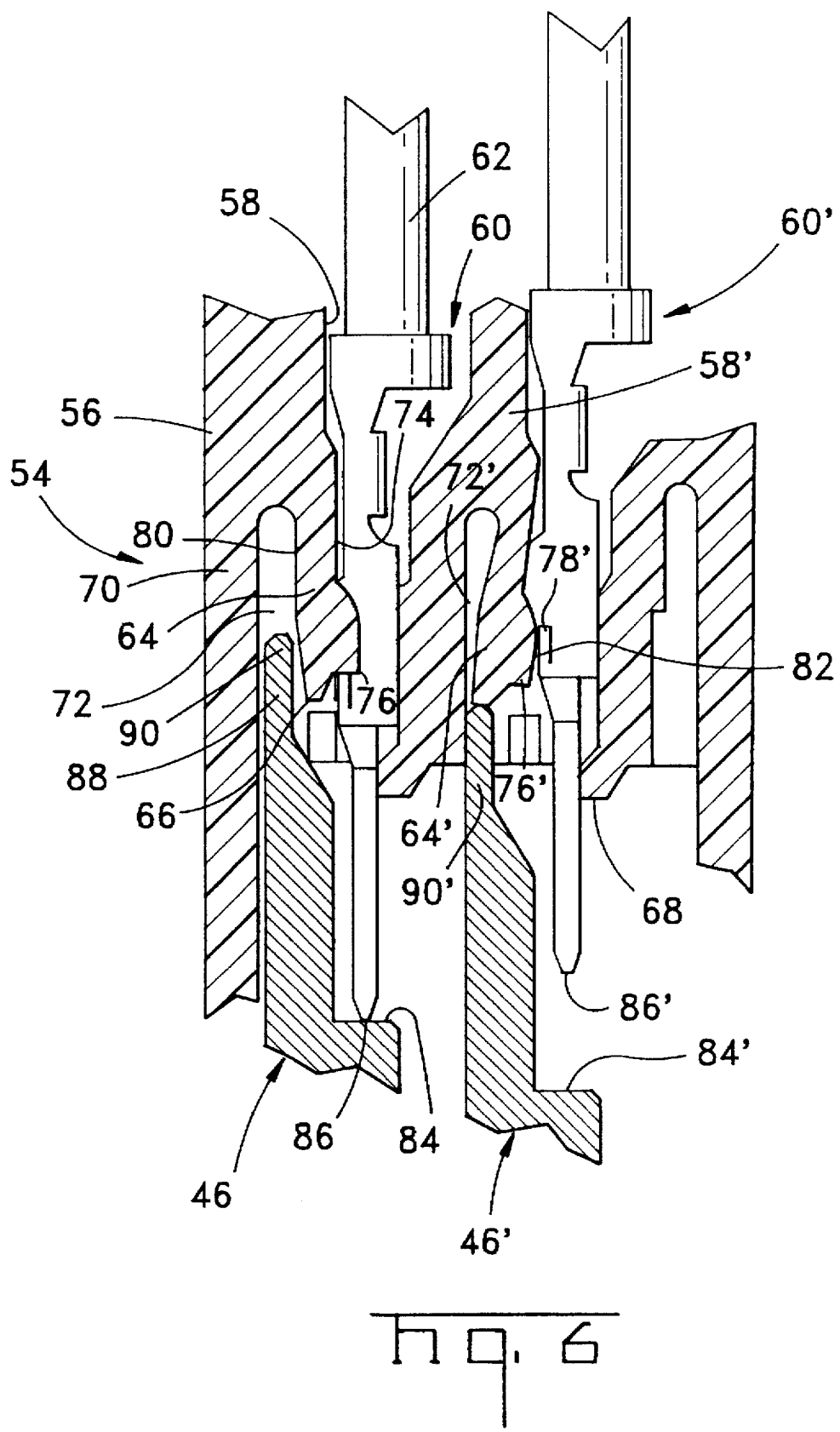
FIG. 6 is a partial cross-sectional view through a connector assembly being tested by the tester.

Referring to FIGS. 1,4 and 6, the testing module 4 will now be explained. The module 4 comprises a housing 36 comprising a plurality of contacts 38 axially extending therethrough and interconnected to an electrical testing circuit (not shown) via leads extending away from the ends 40. The contacts 38 have spring mounted contact ends 42 that are resiliently depressible in the axial direction. The module 4 comprises a further housing 44 having a plurality of axially extending contact probes 46 that are aligned and abut at one end 48 the resilient contact ends 42, and at the other ends project towards the connector receiving cavity 32. In the embodiment of FIGS. 1,2 and 4, two rows 50,52 of contact probes are disposed in the housing 44, this disposition corresponding to the disposition of terminals of a connector assembly to be tested.

Referring to FIG. 6, part of an electrical connector assembly 54 is shown comprising an insulative housing 56 having terminal receiving cavities 58 extending axially therethrough for receiving electrical terminals 60 attached to conducting wires 62 of a harness. The housing 56 comprises integrally moulded resilient cantilever beam locking lances 64 having free ends 66 extending towards a mating end 68 of the connector. Connector housing walls 70 bound the cavities 58, and the locking lance 64 is separated from the wall 70 (to which it is attached) by a slot 72. On a terminal side 74 of the locking lance, that faces into the cavity 60, protrudes a locking projection 76 positioned proximate the free end 66 for engaging in a recess 78 of the terminal for locking of the terminal within the housing. An opposing side 80 of the lance 64 faces the slot 72.

The terminal 60 is shown in its fully assembled position within the cavity 58 whereby the locking protrusion 76 is engaged in the recess 78 of the terminal. An adjacent terminal 60' is shown almost, but not completely inserted into its corresponding cavity 58' such that the locking protrusion 76' is not engaged within the recess 78'. The locking protrusion 76' is thus seated on an outer surface 82 of the terminal thereby resiliently biasing the locking lance 64 into the slot 72.

The contact probes 46 comprise a contact surface 84 positioned for abutment with an end 86 of the terminal 60, and an extension 88 extending axially from the contact face 84 towards the connector 54. A tip 90 of the extension 88 is insertable into the slot 72 adjacent and substantially against the locking lance opposing face 80. As can be seen in FIG. 6, the contact probe 46 which is axially aligned with the terminal 60 is axially movable towards the terminal until the tip of the terminal 86 abuts and electrically contacts the contact face 84 of the probe 46. Simultaneously to the latter, the extension tip 90 is inserted into the slot 72. The contact probe 46' that is axially aligned with and moved towards the partially inserted terminal 60' however does not make contact with the terminal due to abutment of the tip 90' with the locking lance 64' which is biased into the slot 72'. The latter thus ensures that a partially inserted terminal cannot be contacted by the corresponding contact probe and will thus be detected.

In the prior art designs, an almost completely inserted terminal such as 60' which is however not correctly secured, may be contacted by the contact probes due to their certain axial resilient movement that they are provided with. The latter is necessary to compensate for certain tolerances in the positioning of the terminals with respect to the tester module. In this invention, large axial tolerances can compensated for whilst nevertheless ensuring that incompletely inserted terminals cannot be electrically contacted by the probes.

General functioning of the overall tester 2 will now be described with reference to FIGS. 1–4. A connector assembly 54 for testing is inserted into the connector receiving cavity 32 of the tester plate 14. Insertion of the connector 54 into the cavity 32 biases the retention hook 20 thereaway in opposition to a spring force provided by a spring member 92 acting upon the retention member 20. On full insertion of the connector into the cavity 32 the retention member engages over a rear edge of the connector housing thereby securely retaining the connector therein. Full insertion of the connector in the cavity 32 also depresses the button 30 which activates the switch mechanism 28 which is electrically connected to the command of the piston motor 16. The piston motor is thus activated by the switch upon entry of the connector into the cavity 32 for axial movement of a piston arm 94 that is interconnected via a plate member 96 to the module 4 which is thus axially moved towards the connector mating face 68. The contact probes 46 are thus inserted towards the connector for testing correct insertion of the terminals therein as shown in FIG. 6. When the contact probes 46,46' either abut the terminal tips 86, or the housing lance 64' in the case of an incorrectly inserted terminal, the contact probes 46, 46' are resiliently depressed with respect to the module housing 44 by abutment against the resiliently mounted contacts 42 that are interconnected to the electrical testing circuit. The contact probes are maintained biased axially towards the base plate 14 even when not inserted against the connector by the spring mounted contacts 42 that are prestressed. The contact probes 46 are retained from axial movement thereaway by L-shaped retention portions 100 that engage the module housing 44.

After testing, the connector can be extracted from the cavity 32 by releasing the retention member 20. This is done by either manually depressing the lever arm 22 to the position shown in phantom lines 102, or by actuation of the piston motor 24 that interconnected to the lever arm 22 by a piston rod 104 attached to the arm 26 that has a transverse engaging portion 106 engaging the lever arm 22. The switch 28, module piston motor 16, and release member piston motor 24 could all be electrically connected to a control circuit that actuates and controls the motors, testing procedure and release of the connector in a fully automated procedure. The latter would be ideal for implementation in a fully automated cable making machine whereby the connector assemblies are inserted into the cavities 32 by an automatic gripper mechanism. For manual or semi-automatic production of cable assemblies, insertion of the connector assembly into the cavity 32 could be done manually whereby the connector could be removed by manually depressing the lever 22.

Advantageously therefore, the tester provides a very reliable means of testing correct assembly of terminals in connector housings. Furthermore, the tester can be used for either manual assembly of harnesses, or fully automated assembly thereof.

We claim:

1. A terminal assembly tester for testing the full and correct insertion of terminals in corresponding cavities of a connector housing, the housing having resilient integral locking lances projecting into the cavities for locking of the terminals therein, the tester having a plurality of spring mounted electrical probes aligned with and baisable against the terminals of the connector assembly, wherein the contact probes are longitudinal plate-like members axially slidably mounted in cavities of an insulative housing, and each probe comprises a control surface for contacting a corresponding terminal, and an extension extending axially therefrom and insertable alongside a face of the locking lance if the terminal is fully assembled to the housing, thus allowing the contact surface to abut the terminal, whereby if the terminal is not fully assembled the contact probe extension abuts the housing locking lance thus preventing contact of the contact surface with the terminal.

2. The tester of claim 1 characterized in that the contact probes are biased in an axial forward most position by prestressed spring mounted contacts that are electrically connected to an electrical testing circuit, whereby the forward most position is defined by engagement of retention portions of the probes abutting the housing.

3. The tester of claim 1 characterized in that the tester comprises a support frame within which a contact probe module is situated, the frame having a face plate having a cavity for receiving the connector therethrough for testing, the tester further comprising a retention member proximate the cavity and resiliently biasable over a shoulder of the connector for axial retention thereof during testing.

4. The tester of any of claims 1–3 characterized in that the tester comprises a switch directed into a connector receiving cavity of the tester for detecting the presence of the connector therein for actuation of axial forward movement of the contact probes towards the connector.

5. The tester of any of claims 1–3 characterized in that the tester comprises a motor, interconnected to a housing within which the contact probes are axially slidably mounted, for axial movement of the contact probes towards and away from the connector to be tested.

6. The tester of claim 3 characterized in that the retention member is pivotly mounted and resiliently biasable over a connector for axial retention thereof during testing, the retention member attached to a lever arm that is manually accessible for releasing the connector from the tester.

7. The tester of claim 6 characterized in that the retention member is interconnected to a motor electronically controlled for automatic release of a connector after testing.

* * * * *